United States Patent
Koyano

[11] Patent Number: 5,234,303
[45] Date of Patent: Aug. 10, 1993

[54] IN-VACUUM CONVEYANCE ROBOT
[75] Inventor: Shinji Koyano, Tokyo, Japan
[73] Assignee: Seiko Instruments Inc., Japan
[21] Appl. No.: 692,638
[22] Filed: Apr. 29, 1991
[30] Foreign Application Priority Data
May 15, 1990 [JP] Japan .................. 2-125069
[51] Int. Cl.⁵ .............................. B65G 49/07
[52] U.S. Cl. .................... 414/217; 414/222; 414/416; 414/939; 901/17
[58] Field of Search ........... 414/217, 222, 223, 416, 414/422, DIG. 5; 901/17; 104/282, 284, 290, 292

[56] References Cited

U.S. PATENT DOCUMENTS

| | | | |
|---|---|---|---|
| 3,935,950 | 2/1976 | Burch | 901/17 X |
| 3,951,271 | 4/1976 | Mette | 901/17 X |
| 4,181,465 | 1/1980 | Ridderström | 901/17 X |
| 4,462,332 | 7/1984 | Nath et al. | 414/217 X |
| 4,614,474 | 9/1986 | Sudo | 416/416 X |
| 4,624,617 | 11/1986 | Belna | 104/282 X |
| 4,664,578 | 5/1987 | Kakehi | 414/217 |
| 4,715,764 | 12/1987 | Hutchinson | 414/225 X |
| 4,775,281 | 10/1988 | Prentakis | 414/416 |
| 4,869,801 | 9/1989 | Helms et al. | 414/225 X |
| 4,915,564 | 4/1990 | Eror et al. | 414/225 X |
| 4,921,397 | 5/1990 | Watanabe | 414/223 X |
| 4,951,601 | 8/1990 | Maydan et al. | 414/217 X |
| 4,990,047 | 2/1991 | Wagner et al. | 414/217 |
| 5,092,728 | 3/1992 | Crabb et al. | 414/217 |

Primary Examiner—Michael S. Huppert
Assistant Examiner—James Keenan
Attorney, Agent, or Firm—Bruce L. Adams; Van C. Wilks

[57] ABSTRACT

In a robot for conveying a workpiece or the like 21 in vacuum chambers (16, 24); a conveyance robot for use in a high vacuum, in which magnetic floatation and magnetic drive are applied to a rectilinear movement axis (R-axis) (1, 20) for conveying the workpiece 21, a magnetic seal 9 for shutting off a vacuum side A from an atmospheric air side B is applied to a rotation axis (θ-axis) 25 for rotating the R-axis (1, 20), and a vacuum bellows 14 for shutting off the vacuum side A from the atmospheric air side B is applied to a vertical movement axis (Z-axis) 17 for vertically moving the R-axis (1, 20) and the θ-axis 25, whereby sliding or rolling is avoided in the vacuum.

13 Claims, 3 Drawing Sheets

IN-VACUUM CONVEYANCE ROBOT

BACKGROUND OF THE INVENTION

The present invention relates to a conveyance robot which conveys an article among a plurality of vacuum containers in a CVD apparatus, an etching apparatus, a sputtering apparatus or the like for manufacturing an electron device such as semiconductor integrated circuit, or in a testing apparatus or the like.

In the prior art, systems for conveying a workpiece within a vacuum chamber are classified into a mechanical type and a magnetic floatation type.

The mechanical type includes a robot in which, as shown in FIGS. 4(a) and 4(b), levers 27 and gears 28 are employed for a rectilinear movement axis (R-axis) for moving the workpiece rectilinearly. For a vertical movement axis (Z-axis) for moving the workpiece up and down, a gear 29 and a guide 30 are disposed in a vacuum as shown in FIG. 5. Regarding a rotation axis ($\theta$-axis), as shown in FIG. 6, a gear 32, etc. in the vacuum are rotated in such a way that power is transmitted from the atmospheric air side by a magnetic seal unit 31 employing a magnetic fluid.

On the other hand, the magnetic floatation type includes a conveyance system having the two axes of a $\theta$-axis and a Z-axis, in which a magnet coil section exists in a vacuum, and a conveyance system in which a magnet coil section exists outside a vacuum, but which has only an R-axis. In the former system, gases are emitted due to the heat of the magnet coil section. With the latter system, the extent of the movement of the workpiece is limited by the low degree of freedom.

In the prior-art system of the mechanical type, the drive mechanism elements which have sliding parts, and rolling parts, such as gears, screws and bearings, are located in the vacuum. This leads to the problem that the parts frictionally wear off to produce microscopic particles, which pollute the vacuum atmosphere. In addition, as an expedient for enhancing the wearproofness, thin films of soft metal such as gold, silver or lead are formed on sliding surfaces and rolling surfaces, or boron nitride, silicon nitride, molybdenum disulfide, or the like is applied in the form of thin films so as to utilize solid lubrication. In this case, the durabilities of the films are problematic. Moreover, since the friction factors substances are generally greater in a vacuum than in the atmospheric air, the motions of the sliding parts and the rolling parts are liable to be hampered.

Meanwhile, even with the magnetic floatation type, when the magnet coil section exists in the vacuum, the gas emission from a winding portion forms a pollution source. There is also an example wherein a winding portion is molded with a resin. That example, however, has the problem that the pollution of the vacuum is unexpectedly worsened because the component molecules of the resin vaporized by a temperature rise ascribable to baking exhibit much longer mean free paths in the vacuum than in the atmospheric air.

SUMMARY OF THE INVENTION

It is therefore an object of the present invention to provide an in-vacuum conveyance system which solves the problems stated above.

In one aspect of the present invention, an in-vacuum conveyance robot is characterized in that, for an R-axis, a conveyance carriage on which an article to-be-conveyed is placed in a vacuum atmosphere is floated by the repulsive forces of permanent magnets, and a mover which is made of a magnetic substance and which has teeth at equal intervals and parallel to one another is disposed at the bottom of the conveyance carriage, the mover being digitally moved at regular pitches by a stator which is configured of a large number of electromagnets and permanent magnets and which is located on the atmospheric air side within a conveyance pipe disposed in opposition to the mover for shutting off a vacuum from the atmospheric air, the coils of the electromagnets having their excitation conditions changed by applying input pulse signals thereto in dependence on a moving direction. In addition, the in-vacuum conveyance robot is characterized in that, for a $\theta$-axis, a bearing, a motor, gears, etc. which are components of a rotation mechanism are disposed on the atmospheric air side by employing a magnetic fluid as a seal. Besides, the robot is characterized in that, for a Z-axis, a guide, a cylinder, etc. which are components of a vertical movement mechanism are disposed on the atmospheric air side by employing a metal bellows as a seal.

According to the in-vacuum conveyance robot of the present invention thus constructed, no mechanical sliding exists in the vacuum. More specifically, regarding the R-axis, in order to drive the mover which is attached to the conveyance carriage carrying the article to-be-conveyed thereon, the pulse currents are sequentially supplied to the plurality of electromagnets located on the atmospheric air side, whereby the mover is rectilinearly moved along the stator. In addition, the $\theta$-axis performs a rotation in the state in which the sliding parts are located on the atmospheric air side owing to a magnetic fluid seal. Besides, the Z-axis performs a vertical movement in the state in which the sliding parts are located on the atmospheric air side owing to a bellows seal. In this manner, the 3-axis movements of the article to-be-conveyed can be effected without raising a dust.

DESCRIPTION OF THE PREFERRED EMBODIMENT

Figure 1:
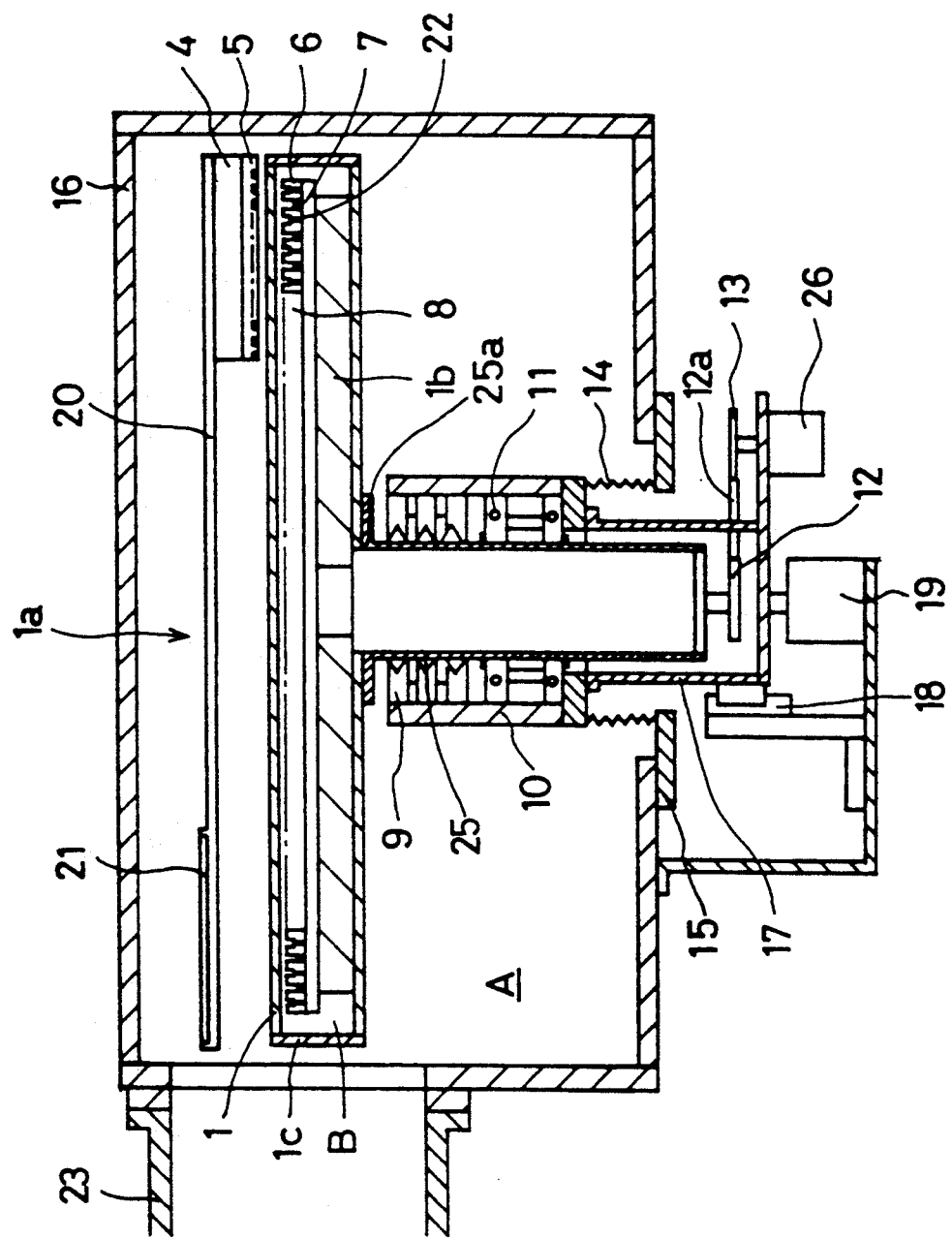
FIG. 1 is a sectional view showing an embodiment of an in-vacuum conveyance robot according to the present invention.
Figure 2:
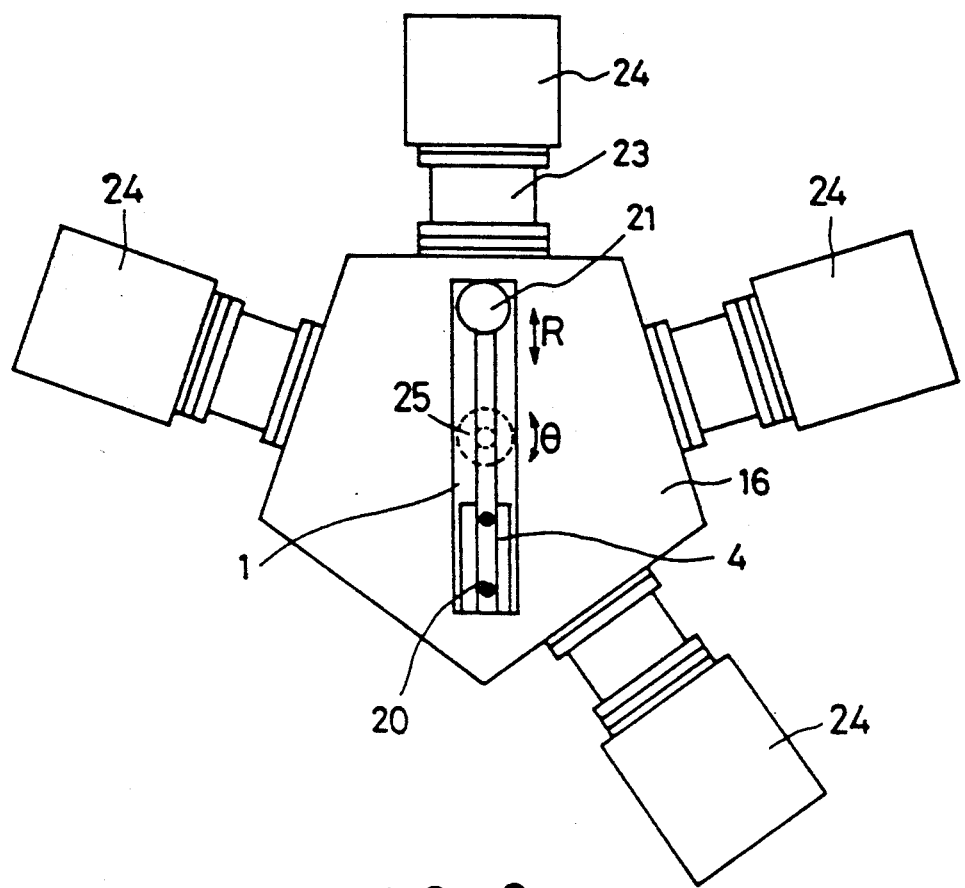
FIG. 2 is a plan view of a vacuum apparatus in which the embodiment is included.
Figure 3:
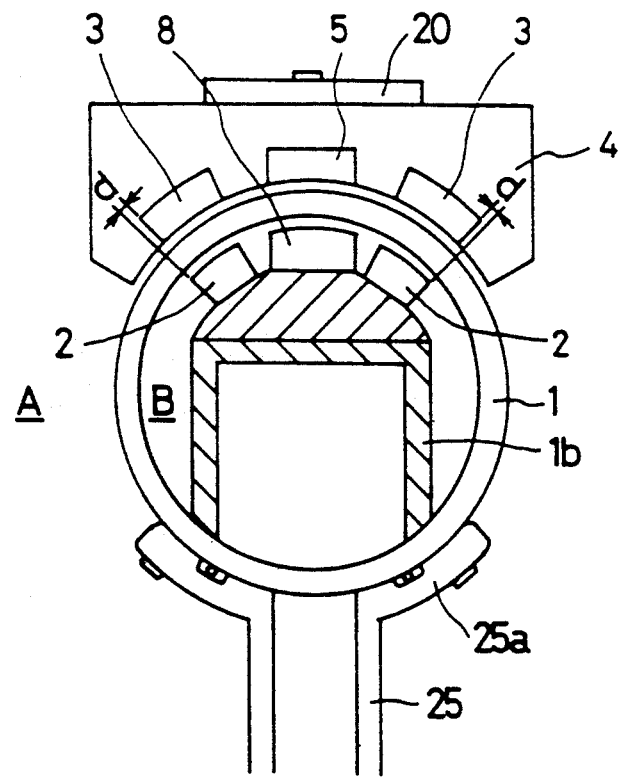
FIG. 3 is a sectional view of the vacuum apparatus showing a conveyance pipe and associated portions.
Figure 4A:
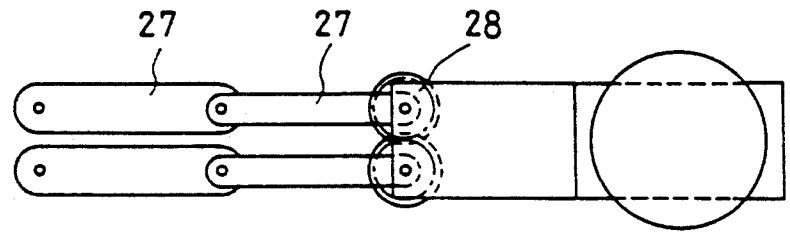
FIGS. 4(a) and 4(b), FIG. 5 and FIG. 6 are views showing a mechanical type conveyance system in the prior art.
Figure 4B:
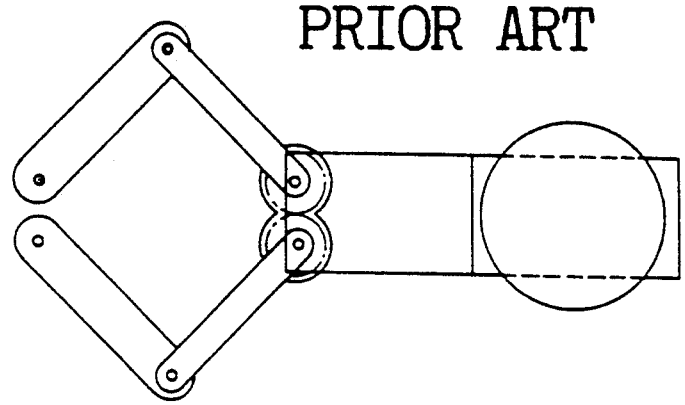
Figure 5:
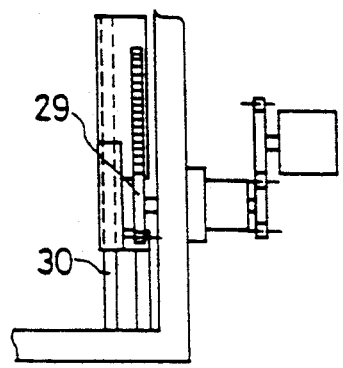
Figure 6:
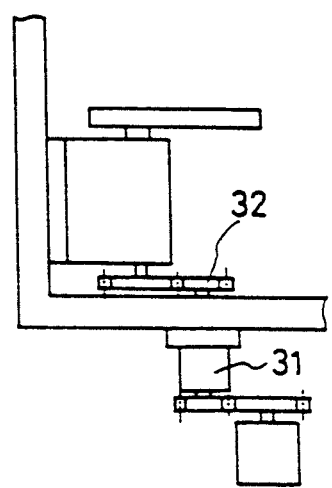

Now, an embodiment of the present invention will be described with reference to the drawings. FIG. 1 is a sectional view of one embodiment of the present invention, FIG. 2 is a plan view of a vacuum apparatus including the embodiment, and FIG. 3 is a sectional view of a conveyance pipe used in the embodiment.

First, the whole construction of a vacuum apparatus to which the present invention is applied will be described with reference to FIG. 2.

The vacuum apparatus is so constructed that a plurality of vacuum containers (subchambers) 24 are radially mounted on a polygonal vacuum container (main chamber) 16 through respective gate valves 23. The interior of the main chamber 16 is brought into or shut off from communication with each of the subchambers 24 by opening or closing the corresponding gate valve 23.

In the main chamber 16, there is installed a polar-coordinate type robot movable along an R-axis (1a in FIG. 1) which is configured of a conveyance arm 20 and a conveyance pipe 1 with built-in means (a stator 8 in FIGS. 1 and 3) for driving the arm 20, movable about a $\theta$-axis (25 in FIGS. 1 and 3) which rotates the R-axis, and movable along a Z-axis (corresponding to a bracket 17 in FIG. 1) which moves the R-axis and the $\theta$-axis up and down.

The conveyance arm 20 disposed in the main chamber 16 has its one end fixed to a conveyance carriage 4, has an article to-be-conveyed 21, such as a workpiece or a workpiece cassette, placed on its other end, and is moved rectilinearly in senses indicated by a double-headed arrow R. The conveyance carriage 4 is supported by magnetic floatation over the conveyance pipe 1 which is vertically moved and is rotated as indicated by a double-headed arrow $\theta$, within the main chamber 16. Further, the conveyance carriage 4 for rectilinearly moving the conveyance arm 20 is rectilinearly moved in the senses R by drive means (8) included inside the conveyance pipe 1.

Accordingly, the conveyance arm 20 is capable of moving rectilinearly, rotationally and vertically and is capable of conveying the workpiece or the like 21 between the interior of each subchamber 24 and that of the main chamber 16.

Next, the structure of the polar-coordinate the conveyance robot will be described with reference to FIGS. 1 and 3.

The conveyance pipe 1 is made of a nonmagnetic substance, and it shuts off the vacuum side, namely, the interior A of the main chamber 16 from the atmospheric air side, namely, the interior B of the conveyance pipe 1. On the atmospheric air side B, two rows of stationary side magnets 2 for floatation shown in FIG. 3 are fixed to a fitting member 1b so as to extend in the depthwise direction of this figure. As seen from FIG. 1, a lid 1c is airtightly fixed to each end of the conveyance pipe 1 by bolts and an O-ring or the like.

The conveyance carriage 4 is furnished with two rows of permanent magnets 3 opposing to the stationary side floatation magnets 2, and it is kept floated by repulsive forces developing between the stationary side floatation magnets 2 and the permanent magnets 3. As indicated in FIG. 3, each row of the permanent magnets 3 of the conveyance carriage 4 is offset a predetermined magnitude d inwards of the corresponding row of the stationary side floatation magnets 2 as viewed in the circumferential direction of the conveyance pipe 1. Thus, the repulsive forces act as righting moments so that the conveyance carriage 4 may assume its neutral position. As shown in FIG. 1, a mover 5 which is made of a magnetic substance and which is formed with teeth at equal intervals is fixed between the rows of the permanent magnets 3 at the bottom of the conveyance carriage 4. In the conveyance pipe 1, the stator 8 in which electromagnets 6 and permanent magnets 7 are alternately arrayed is fixed so as to oppose the mover 5 and to extend in the lateral direction of FIG. 1. Each of the mover 5 and the stator 8 is constructed in the form of a linear motor or a linear pulse motor.

The $\theta$-axis is defined by a tubular support member 25 which is fixed centrally of the lower surface part of the conveyance pipe 1, and the support member 25 is formed with a T-shaped portion (flange) 25a at its upper end. The flange 25a is airtightly fixed to the conveyance pipe 1 by welding or by bolts through an O-ring.

The $\theta$-axis support member 25 is rotatably journaled in a bearing 11 held in a $\theta$-axial outer barrel 10 or tubular member, and it is furnished with a magnetic seal 9 utilizing a magnetic fluid, as means for shutting off the atmospheric air and the vacuum. The magnetic seal 9, bearing 11 and support member 25 can move up and down unitarily with the outer barrel 10. A gear 12 is mounted on the bottom surface of the support member 25, and it is driven through an intermediate gear 12a as well as a driving gear 13 by a motor 26 so as to rotate the tubular support member 25. The gears 12, 12a and 13 and the motor 26 are arranged on the atmospheric air side.

One end face of a bellows 14 is welded to the bottom surface of the $\theta$-axial outer barrel 10, while the other end face thereof is welded to a flange 15. The flange 15 is fixed to the opening portion of the lower wall of the main chamber 16 through a sealant (not shown). The flange 15, bellows 14, outer barrel 10 and magnetic seal 9 airtightly shut off the interior of the main chamber 16 from the atmospheric air. A bracket 17 is fixed to the atmospheric air side of the bottom of the $\theta$-axial outer barrel 10. The bracket 17 has the motor 26 and the rod of a cylinder 19 fixed thereto, and it is moved up and down by a cylinder 19 while being guided by a guide 18. The bracket 17 and the guide 18 are constructed to define the Z-axis. Incidentally, the conveyance arm 20 is attached to the conveyance carriage 4 as shown in FIG. 1, and the article to-be-conveyed 21 is put on a stepped portion at the distal end of the conveyance arm and maintained thereon by its own weight.

Now, the operation of the conveyance robot will be described as to the three degrees of freedom of movement of the conveyance arm 20.

To effect the R-axis movement of the conveyance arm 20, input pulse signals are supplied to coils 22 of the stator 8 which is configured of the electromagnets 6 and the permanent magnets 7. In response to the pulse signals the excitation conditions of coils 22 constituting the electromagnets 6 are changed depending upon the moving direction of the mover 5. In this way, the mover 5 and, in turn, the conveyance arm 20 can be moved along the R axis at regular pitches in digital fashion.

To effect the $\theta$-axis movement of the conveyance arm 20, the support member 25 is rotated by driving the motor 26. Thus, the conveyance pipe 1 can be rotated any desired angle about the $\theta$ axis in a desired direction.

To effect the Z-axis movement of the conveyance arm 20, the bracket 17 fixed to the $\theta$-axial outer barrel 10 is vertically moved by the cylinder 19 while being guided by the guide 18. The outer barrel 10, magnetic seal 9, bearing 11 and support member 25 are vertically and unitarily moved along with the vertical movement of the bracket 17, thereby vertically moving the conveyance arm 20 along the Z axis. Accordingly, vertical movement of the bracket 17 can vertically move the R-axis 1a and the $\theta$-axis as a whole.

The 3-axis robot described above is disposed in the polygonal main chamber 16, the interior of which is shut off from the atmospheric air. It can convey the article to-be-conveyed 21 into the subchambers 24 radiately arranged through the gate valves 23 as shown in FIG. 2, by a combination of the $\theta$-axis rotational movements, R-axis horizontal movements and Z-axis vertical movements.

By the way, although the cylinder 19 has been mentioned as the Z-axis actuator in the foregoing embodiment, it can be altered into any other actuator. Also, although the gearing has been employed for transmitting the power of the motor 26, it can be replaced with any other suitable mechanism. Besides, although the polygonal main chamber 16 has been illustrated as being pentagonal in the embodiment, it can be in any desired polygonal shape or a circular shape without being restricted to the pentagonal shape.

The embodiment has been described as to the conveyance in the vacuum containers the internal vacua of which are shut off from the atmospheric air. Needless to say, however, the present invention can be also performed when both sides between which an article is conveyed are under the atmospheric air condition.

As described above, in the 3-axis, conveyance mechanism, the R-axis utilizes the magnetic floatation, the $\theta$-axis drive section is disposed on the atmospheric air side by employing the magnetic fluid for the seal, and the Z-axis drive section is disposed on the atmospheric air side by employing the bellows for the seal, whereby, any sliding part on the vacuum side is eliminated so as to raise no dust, and the emission of gases is also avoided. Moreover, by properly controlling the three axes, the article to-be-conveyed can be conveyed without inflicting any damage thereon. Further, since the conveyance mechanism has the degree of freedom of the three axes, it affords a large extent of movements. Still further, the conveyance mechanism is structurally simple and is easy of maintenance, so that it can prolong its lifetime and can convey articles at a high reliability.

What is claimed is:

1. An in-vacuum conveyance robot comprising: a conveyance carriage carrying a conveyance arm for holding an article to be conveyed and located in a vacuum atmosphere, a mover made of a magnetic material and having a plurality of teeth disposed at regular intervals and parallel to one another and located beneath said conveyance carriage, a conveyance pipe made of a nonmagnetic material and which shuts off the vacuum from an atmospheric air atmosphere, a stator having electromagnets and permanent magnets and located in the atmospheric air atmosphere inside said conveyance pipe in opposition to said mover, permanent magnets mounted at the bottom of said conveyance carriage, an R-axis drive section including stationary magnets for flotation located inside said conveyance pipe and coating with said permanent magnets to develop repulsive forces effective to magnetically float said conveyance carriage above said conveyance pipe, rotation means for rotating the conveyance pipe, a $\theta$-axis drive section including a sealing portion made of a magnetic fluid for sealing said rotation means from the vacuum atmosphere, vertical movement means for moving the conveyance pipe up and down, and a Z-axis drive section including a sealing portion made of flexible bellows for sealing said vertical movement means from the vacuum atmosphere.

2. A conveyance robot comprising: a movable arm for conveying an article during use of the robot; a movable pipe disposed beneath the arm; first magnetic means disposed within the pipe coating with second magnetic means carried by the arm for magnetically floating the arm above the pipe without contact between the arm and pipe; first means mounting the arm for linear movement along a horizontal axis while the arm is magnetically afloat above the pipe to define one degree of freedom of the arm; second means mounting the pipe for angular movement about a vertical axis to effect corresponding angular movement of the arm while magnetically afloat above the pipe to define a second degree of freedom of the arm; third means mounting the pipe for vertical movement along the vertical axis to effect corresponding vertical movement of the arm while magnetically afloat above the pipe to define a third degree of freedom of the arm; second drive means for angularly driving the pipe about the vertical axis while the arm is magnetically afloat above the pipe to thereby angularly drive the arm about the vertical axis, the second drive means comprising a support member connected to and supporting the pipe, means mounting the support member for angular displacement about the vertical axis, and means for angularly driving the support member to effect angular movement of the pipe and corresponding angular movement of the arm which is magnetically afloat above the pipe; third drive means for vertically driving the pipe along the vertical axis while the arm is magnetically afloat above the pipe to thereby vertically drive the arm along the vertical axis, the third drive means comprising means mounting the support member for vertical displacement along the vertical axis, and means for vertically driving the support member to effect vertical movement of the pipe and corresponding vertical movement of the arm which is magnetically afloat above the pipe, the means mounting the support member for vertical displacement comprising a vertically displaceable outer tubular member disposed outside of and surrounding the support member, means connecting the support member to the outer tubular member to undergo vertical displacement therewith, and means for vertically displacing the outer tubular member; a chamber having the conveyance robot disposed therein with a bottom portion of the support member extending downwardly through an opening in the chamber; and means defining an airtight magnetic seal between the exterior of the support member and the interior of the chamber.

3. A conveyance robot according to claim 2, including first drive means for linearly driving the arm along the horizontal axis.

4. A conveyance robot according to claim 3, wherein the first drive means comprises a linear motor.

5. A conveyance robot according to claim 4; wherein the linear motor comprises electromagnets disposed lengthwise in the pipe, and means carried by the arm and coating with the electromagnets for linearly driving the arm.

6. A conveyance robot according to claim 3; wherein the pipe has a longitudinal axis which extends parallel to the horizontal axis.

7. A conveyance robot according to claim 2, including means defining an airtight seal between the outer tubular member and the interior of the chamber.

8. A conveyance robot according to claim 7; wherein the means defining an airtight seal comprises a flexible bellows having one end connected to the outer tubular member and another end connected to the chamber.

9. A conveyance robot according to claim 2; wherein the first and second magnetic means generate magnetic repulsive forces effective to maintain the arm magnetically afloat over the pipe.

10. A conveyance robot according to claim 9; wherein the first and second magnetic means are positioned relative to each other so that the magnetic repulsive forces apply righting moments to the arm to maintain the arm in a neutral position relative to the pipe.

11. A conveyance robot comprising: a movable arm for conveying an article during use of the robot; a movable pipe disposed beneath the arm; first magnetic means disposed within the pipe coating with second magnetic means carried by the arm for magnetically floating the arm above the pipe without contact between the arm and pipe; first means mounting the arm for linear movement along a horizontal axis while the arm is magnetically afloat above the pipe to define one degree of freedom of the arm; second means mounting the pipe for angular movement about a vertical axis to effect corresponding angular movement of the arm while magnetically afloat above the pipe to define a second degree of freedom of the arm; third means mounting the pipe for vertical movement along the vertical axis to effect corresponding vertical movement of the arm while magnetically afloat above the pipe to define a third degree of freedom of the arm; and drive means for vertically driving the pipe along the vertical axis while the arm is magnetically afloat above the pipe to thereby vertically drive the arm along the vertical axis, the drive means comprising a support member connected to and supporting the pipe, means mounting the support member for vertical displacement along the vertical axis, and means for vertically driving the support member to effect vertical movement of the pipe and corresponding vertical movement of the arm which is magnetically afloat above the pipe, the means mounting the support member for vertical displacement comprising a vertically displaceable outer tubular member disposed outside of and surrounding the support member, means connecting the support member to the outer tubular member to undergo vertical displacement therewith, and means for vertically displacing the outer tubular member.

12. A conveyance robot according to claim 11; including a chamber having the conveyance robot disposed therein with a bottom portion of the support member extending downwardly through an opening in the chamber; and means defining an airtight seal between the outer tubular member and the interior of the chamber.

13. A conveyance robot according to claim 12; wherein the means defining an airtight seal comprises a flexible bellows having one end connected to the outer tubular member and another end connected to the chamber.

* * * * *